(12) United States Patent
Alderson et al.

(10) Patent No.: US 8,188,804 B2
(45) Date of Patent: *May 29, 2012

(54) SYSTEM AND METHOD OF SHAPING A POWER SPECTRUM IN PWM AMPLIFIERS

(75) Inventors: Jeffrey Alderson, Driftwood, TX (US);
John Khoury, Austin, TX (US);
Richard Beale, Austin, TX (US)

(73) Assignee: Silicon Laboratories, Inc., Austin, TX (US)

(*) Notice: Subject to any disclaimer, the term of this patent is extended or adjusted under 35 U.S.C. 154(b) by 88 days.

This patent is subject to a terminal disclaimer.

(21) Appl. No.: 12/767,605

(22) Filed: Apr. 26, 2010

(65) Prior Publication Data

US 2010/0207699 A1 Aug. 19, 2010

Related U.S. Application Data

(63) Continuation of application No. 12/208,535, filed on Sep. 11, 2008, now Pat. No. 7,724,105.

(60) Provisional application No. 61/072,563, filed on Apr. 1, 2008.

(51) Int. Cl.
*H03F 3/38* (2006.01)
*H03K 7/08* (2006.01)

(52) U.S. Cl. ............. 332/107; 332/109; 330/10

(58) Field of Classification Search .......... 332/107, 332/109–111; 327/172–177; 330/10; 375/238; 381/104

See application file for complete search history.

(56) References Cited

U.S. PATENT DOCUMENTS

| | | | |
|---|---|---|---|
| 5,014,016 A | 5/1991 | Anderson | |
| 5,247,581 A | 9/1993 | Gurcan | |
| 5,389,829 A | 2/1995 | Milazzo | |
| 5,672,998 A | 9/1997 | Wittlinger | |
| 5,798,672 A | 8/1998 | Masini et al. | |
| 6,097,249 A | 8/2000 | Strickland et al. | |
| 6,127,885 A | 10/2000 | Colangelo | |
| 6,160,455 A | 12/2000 | French et al. | |
| 6,297,692 B1 | 10/2001 | Nielsen | |
| 6,552,606 B1 | 4/2003 | Veltman et al. | |
| 6,552,607 B1 | 4/2003 | Danielson | |
| 6,563,377 B2 | 5/2003 | Butler | |
| 6,594,309 B1 | 7/2003 | Botti et al. | |
| 6,597,240 B1 | 7/2003 | Walburger et al. | |

(Continued)

OTHER PUBLICATIONS

Kempski, A et al., "Decomposition of EMI Noise into Common and Differential Modes in PWM Inverter Drive System", Electrical Power Quality and Utilization Journal, V. XXII, N. 1, (2006), 6 Pages.

(Continued)

*Primary Examiner* — David Mis
(74) *Attorney, Agent, or Firm* — Cesari & Reed, LLP; R. Michael Reed

(57) ABSTRACT

In a particular embodiment, a circuit device is disclosed that includes a data generator adapted to output a random pulse sequence having a particular spectral shape. The circuit device further includes a pulse edge control circuit to selectively apply a carrier suppression operation to at least one pulse-width modulated (PWM) signal in response to the random pulse sequence to produce at least one modulated PWM output signal. The spectral energy associated with a PWM carrier of the modulated PWM output signal at a carrier frequency and associated harmonics is changed such that the modulated PWM output signal has a spectral shape defined by the particular spectral shape.

23 Claims, 10 Drawing Sheets

U.S. PATENT DOCUMENTS

| | | | |
|---|---|---|---|
| 6,653,897 | B2 | 11/2003 | Sawashi |
| 6,794,932 | B1 | 9/2004 | Butler |
| 6,847,257 | B2 | 1/2005 | Edwards et al. |
| 7,046,080 | B2 | 5/2006 | Watts et al. |
| 7,068,095 | B2 | 6/2006 | Bernardon |
| 7,078,964 | B2 | 7/2006 | Risbo et al. |
| 7,119,629 | B2 | 10/2006 | Nielsen et al. |
| 7,142,049 | B2 | 11/2006 | Kirn |
| 7,142,050 | B2 | 11/2006 | Risbo |
| 7,190,224 | B2 | 3/2007 | Sutardja |
| 7,218,173 | B2 | 5/2007 | Nalbant |
| 7,230,485 | B2 | 6/2007 | De Cremoux et al. |
| 7,242,248 | B1 | 7/2007 | Sutardja |
| 7,262,658 | B2 | 8/2007 | Ramaswamy et al. |
| 7,279,965 | B2 | 10/2007 | Hansen et al. |
| 7,298,209 | B1 | 11/2007 | Sutardja |
| 7,301,417 | B2 | 11/2007 | Shinohara |
| 7,332,962 | B2 | 2/2008 | Wu et al. |
| 7,480,331 | B2 * | 1/2009 | Braun ............ 375/238 |
| 7,561,002 | B1 | 7/2009 | Hariton |
| 7,598,895 | B1 | 10/2009 | Khoury |
| 7,649,961 | B2 * | 1/2010 | Midya ............ 375/321 |
| 7,791,521 | B2 | 9/2010 | Khoury |
| 2003/0020539 | A1 | 1/2003 | Sawashi |
| 2003/0067348 | A1 | 4/2003 | Butler |
| 2003/0122615 | A1 | 7/2003 | Zeff |
| 2004/0169552 | A1 | 9/2004 | Butler |
| 2004/0232978 | A1 | 11/2004 | Easson et al. |
| 2004/0232979 | A1 | 11/2004 | Edwards et al. |
| 2005/0054307 | A1 | 3/2005 | Watts et al. |
| 2005/0083114 | A1 | 4/2005 | Risbo |
| 2005/0083115 | A1 | 4/2005 | Risbo |
| 2005/0083116 | A1 | 4/2005 | Risbo et al. |
| 2005/0099231 | A1 | 5/2005 | Sutardja |
| 2005/0116770 | A1 | 6/2005 | Kirn |
| 2005/0200404 | A1 | 9/2005 | Bernardon |
| 2006/0008095 | A1 | 1/2006 | Tsuji |
| 2006/0077007 | A1 | 4/2006 | De Cremoux et al. |
| 2006/0103458 | A1 | 5/2006 | Hansen et al. |
| 2006/0226904 | A1 | 10/2006 | Nalbant |
| 2006/0279354 | A1 | 12/2006 | Hansen et al. |
| 2007/0002943 | A1 | 1/2007 | Midya |
| 2007/0024365 | A1 | 2/2007 | Ramaswamy et al. |
| 2007/0146069 | A1 | 6/2007 | Wu et al. |
| 2007/0229159 | A1 | 10/2007 | Krishnan et al. |
| 2008/0042743 | A1 | 2/2008 | Wong et al. |

OTHER PUBLICATIONS

Ogasawara, S., et al., "Suppression of Common Mode Voltage in a PWM Rectifier/Inverter System", Department of Electrical Engineering, Tokyo Institute of Technology IEEE, (2001), 2015-2021.

* cited by examiner

SYSTEM AND METHOD OF SHAPING A POWER SPECTRUM IN PWM AMPLIFIERS

CROSS-REFERENCE TO RELATED APPLICATION(S)

The present application is a continuation patent application of and claims priority from U.S. patent application Ser. No. 12/208,535 entitled "SYSTEM AND METHOD OF SHAPING A POWER SPECTRUM IN PWM AMPLIFIERS" and filed on Sep. 11, 2008, which is hereby incorporated by reference in its entirety, and which is a non-provisional patent application of and claims priority from U.S. provisional patent application Ser. No. 61/072,563, filed Apr. 1, 2008 and entitled "COMMON MODE CARRIER SUPPRESSION AND SPECTRAL SHAPING IN CLASS D AMPLIFIERS," the content of which is hereby incorporated by reference in its entirety.

FIELD OF THE DISCLOSURE

This disclosure generally relates to a system and method of shaping a common mode spectrum in pulse-width modulated (PWM) amplifiers.

BACKGROUND OF THE DISCLOSURE

Conventionally, class D audio amplifiers have the benefit of high power efficiency, but such amplifiers can also have a drawback in terms of electromagnetic interference (EMI), which can interfere with nearby wireless receivers, violate Federal Communication Commission (FCC) emission limits, or any combination thereof. Audio Class D amplifiers often switch at a frame rate of a few hundred kHz, and common mode energy at a carrier frequency and its harmonics can fall directly in the amplitude modulated (AM) radio frequency band, interfering with nearby AM receivers.

FIG. 1 illustrates a graph 100 of a "BD modulation" employed by many class D amplifiers. Class BD-D modulation varies pulse widths of two pulse waves that are time-aligned and often nominally centered within a pulse-width modulated (PWM) frame, which has a frame width (T). For positive input signals, the pulse width PWM B signal 102 that drives the high side of the bridged output (typically referred to as a P or B pulse) is increased (such as by a delta ($\Delta$)) while the pulse width of PWM D signal 104 that drives the low side of the bridged output (typically referred to as an N or D pulse) is decreased (such as by the delta ($\Delta$)). For negative PWM input signals, a width of the PWM D (or N) signal 104 is increased while the width of the PWM B (or D) signal 102 is decreased, resulting two similar but negative differential pulses. Differentially, this is an efficient arrangement since there is no wasted differential energy.

In this example, a differential mode signal 106 includes pulses that are nominally centered at $\pm T/4$, where T is the width of the PWM frame and the reference time position T=0 represents the center of the frame. The differential mode signal 106 is applied across the load (such as a filter in cascade with a speaker). The carrier frequency of the differential mode signal 106 is at twice the PWM frame rate. However, the common mode signal 108 has a peak energy that is nominally centered at the PWM frame rate. Carrier energy of the common mode signal 108 can interfere with nearby circuitry or radio receivers.

FIG. 2 illustrates a graph of a resulting differential mode power spectrum 200 at the output of an associated H-bridge circuit. As shown, the graph 200 illustrates the differential mode component at twice the frame rate in the frequency domain, where the frame rate is 960 kHz.

FIG. 3 illustrates a graph of a resulting common mode power spectrum 300 at the output of an associated H-bridge circuit, showing a common mode component at the frame rate of 960 kHz. The strong common mode component created at the PWM frame rate, as illustrated by the common mode power spectrum 300, can interfere with nearby radio receivers. Given that practical switching frequencies for audio applications range from approximately 200 kHz to 1000 kHz and that the AM band ranges from 520 kHz to 1710 kHz, there is a problem with radiated interference of the common mode carrier and its harmonics interfering with reception of an AM receiver in close proximity to or within the same system. Therefore, it is desirable to suppress the common mode carrier of a class-BD double sided symmetrical modulated signal with little or no compromise in the differential mode performance. Embodiments described below provide solutions to these and other problems, and offer numerous advantages over the prior art.

SUMMARY

In a particular embodiment, a circuit device is disclosed that includes a data generator adapted to output a random pulse sequence having a particular spectral shape. The circuit device further includes a pulse edge control circuit to selectively apply a carrier suppression operation to at least one pulse-width modulated (PWM) signal in response to the random pulse sequence to produce at least one modulated PWM output signal. The spectral energy associated with a PWM carrier of the modulated PWM output signal at a carrier frequency and associated harmonics is changed such that the modulated PWM output signal has a spectral shape defined by the particular spectral shape. In a particular embodiment, the carrier suppression operation includes a phase shift operation that is applied to selectively shift the at least one PWM input signal by plus or minus a quarter of a PWM frame relative to the frame center according to the random pulse sequence. In another particular embodiment, the carrier suppression operation comprises a chop operation that is selectively applied to chop or not chop the at least one PWM input signal with its duty cycle complement PWM signal according to the random pulse sequence.

In another particular embodiment, a method is disclosed that includes receiving at least one pulse-width modulated (PWM) input signal from a PWM source and receiving a random pulse sequence having a particular spectral shape from a data generator. The method further includes applying a carrier suppression operation to selectively phase shift or to selectively chop the received at least one PWM input signal according to values of the random pulse sequence to produce at least one modulated PWM output signal with a desired spectral shape as defined by the random pulse sequence.

DETAILED DESCRIPTION OF ILLUSTRATIVE EMBODIMENTS

Figure 4:
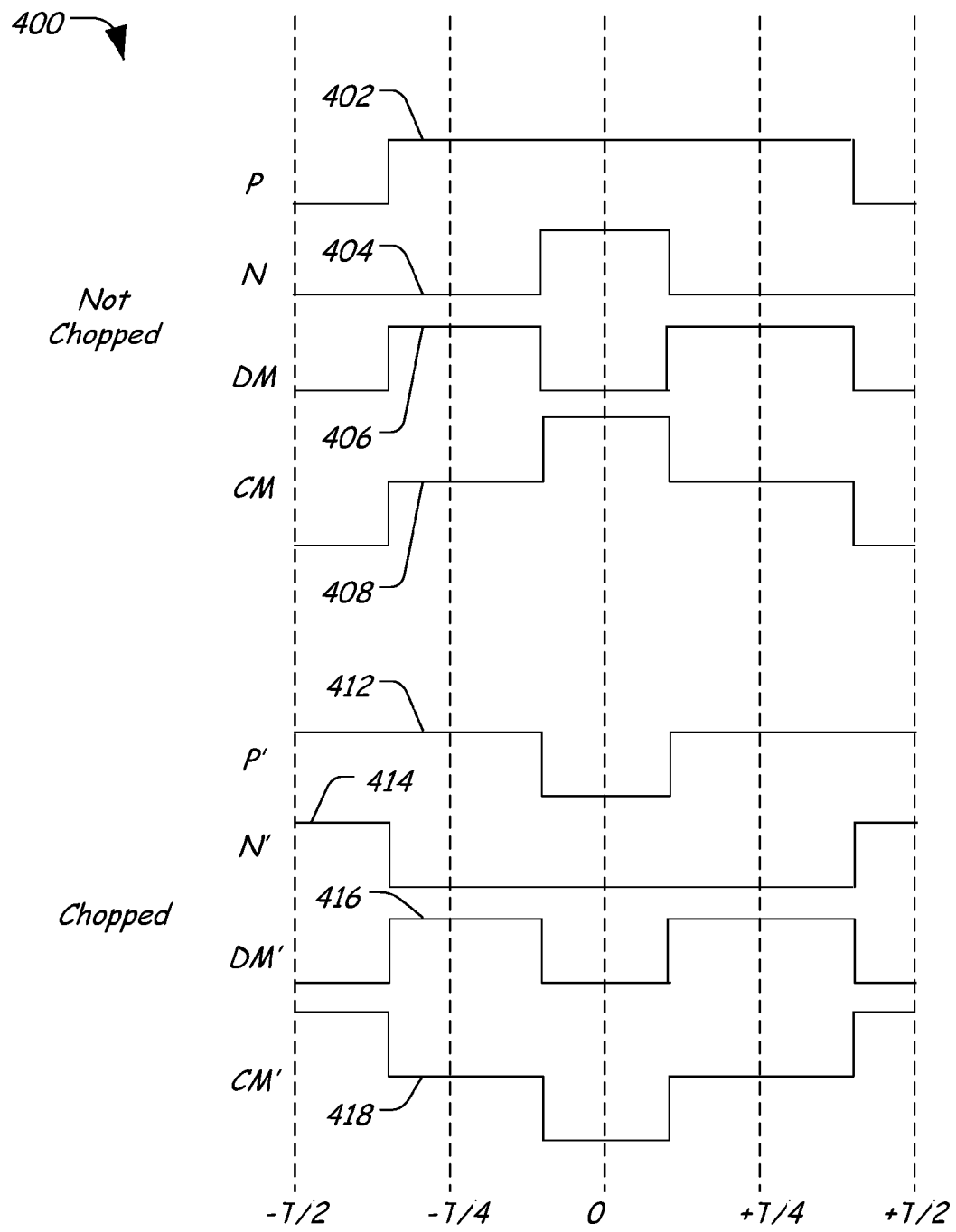
FIG. 4 is a timing diagram of a particular illustrative embodiment of a chop/no chop carrier suppression operation that can be selectively applied to suppress carrier power of a modulated PWM output signal and to spread carrier energy to frequencies other than the carrier frequency and its associated harmonics within a PWM output spectrum.

FIG. 4 is a timing diagram 400 of a particular illustrative embodiment of a chop/no chop carrier suppression operation that can be selectively applied to suppress carrier power of a modulated PWM output signal and to spread carrier energy to frequencies other than the carrier frequency and its associated harmonics within a PWM output spectrum. The timing diagram 400 includes a high side signal (P) 402 and a low side signal (N) 404, which have a differential mode component represented by signal 406 and a common mode component represented by signal 408. The differential mode signal 406 is defined by the following equation:

$$DM(t)=P(t)-N(t) \quad \text{(Equation 1)}.$$

As shown, in the "not chopped" version, the common mode component (signal 408) has a peak amplitude centered at a center of the frame. The common mode signal 408 is defined by the following equation:

$$CM(t)=(P(t)+N(t))/2 \quad \text{(Equation 2)}.$$

The timing diagram 400 also includes a chopped version of the high and low side signals (P and N) 402 and 404, represented by the high side signal (P') 412 and the low side signal (N') 414. In this example, the high side signal (P) 402 is inverted and swapped with the low side signal (N) 404 and becomes the low side signal (N') 414, as shown by the following equation:

$$N'(t)=-P(t) \quad \text{(Equation 3)}.$$

The low side signal (N) 404 is inverted and swapped with the high side signal (P) 402 becomes the high side signal (P') 412, as shown by the following equation:

$$P'(t)=-N(t) \quad \text{(Equation 4)}.$$

In the chopped version, the differential mode signal 416 remains unchanged relative to the "not chopped" version, as defined by the following equation:

$$DM'(t)=P'(t)-N'(t)=-N(t)--P(t)=DM(t) \quad \text{(Equation 5)}.$$

However, the common mode signal 418 is inverted relative to the common mode component of the "not chopped" version represented by the signal 408, as defined by the following equation:

$$CM'(t)=(-N(t)-P(t))/2=-CM(t) \quad \text{(Equation 6)}.$$

In this example, when the signal is chopped, the common mode signal 418 is inverted and the differential mode signal 416 remains unchanged (relative to the differential mode signal 406). The differential mode signal 406 or 416 determines the audio performance in an audio application, and the common mode signal 408 is what is predominantly responsible for electromagnetic interference (EMI). In a particular embodiment, by selectively chopping and not chopping a PWM input signal and its duty cycle complement PWM signal, the common mode carrier energy at the carrier frequency is reduced over a sequence of frames, reducing EMI and radio frequency interference. As used herein, the term "duty cycle complement" refers to a signal that, when aggregated with the PWM input signal, aggregates to an entire width of the PWM frame (within limits of time quantization effects). Further, as used herein, the term "chop" or "chop operation" refers to a technique that inverts the PWM input signal and its duty cycle complement and interchanges them to produce a modulated PWM output. In a particular example, if the chop operation is alternately applied every other frame (e.g., a first PWM pulse is not chopped and a second PWM pulse is chopped), a resulting common mode carrier energy associated with the PWM P and N signals 402 and 404 (and their inverted and swapped (interchanged) versions PWM P' and N' signals 412 and 414) averages to zero at the carrier frequency.

Figure 5:
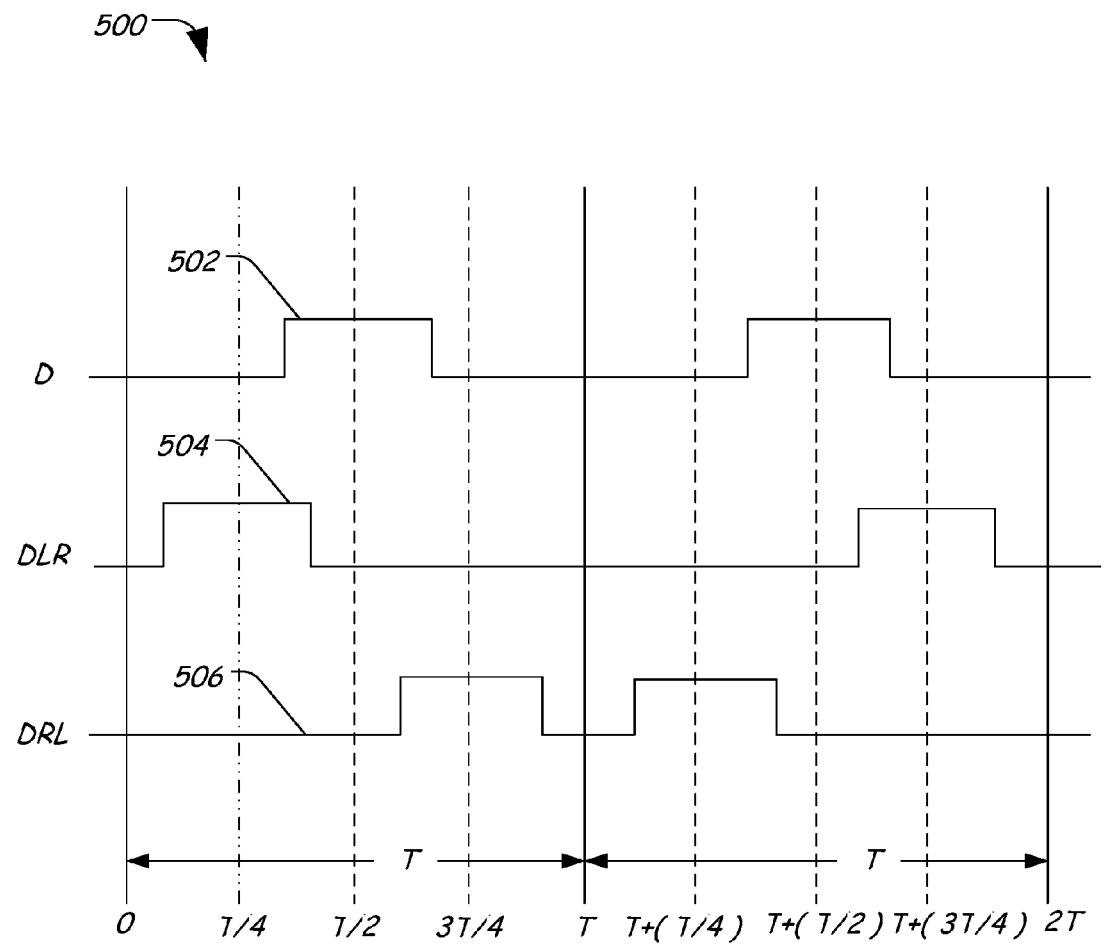
FIG. 5 is a graph of a particular illustrative embodiment of a timing diagram illustrating the basic concept for a quarter-frame phase shift of a single PWM signal to suppress a carrier at the frame rate.

FIG. 5 is a graph of a particular illustrative embodiment of a timing diagram 500 illustrating a quarter frame phase shift of a single pulse-width modulated (PWM) signal to suppress a carrier at the frame rate. The timing diagram 500 includes a PWM D signal 502 that is centered (positioned) within the frame at T/2. Over a two frame interval, the PWM D signal 502 is shifted. In one example, the PWM D signal 502 is shifted left (by −T/4) then right (by +T/4), as illustrated at 504. In another example, the PWM D signal 502 is shifted right (by +T/4) then left (by −T/4), as illustrated at 506.

In this particular example, the pulse width of the PWM D signal 502 is less than half of the frame width (T/2), so shifting the PWM D signal 502 early or late does not introduce any frame edge boundary issues. In other words, shifting of the PWM D signal 502 does not cause any portion of the pulse to cross the frame boundary (such as the PWM frame boundaries at T=0, T, or 2T, illustrated in FIG. 5). The above example represents a quarter-frame symmetrical pulse shift with no wrap-around.

However, when the pulse width is greater than T/2, then boundary problems can arise. For example, if the PWM D signal 502 is wider than T/2, shifting the PWM D signal 502 by a quarter of the frame width would cause a portion of the PWM D signal 502 to extend over the frame boundary (e.g., to cross t=0 or t=T). To avoid having the portion cross the frame boundary, the PWM D signal 502 can be shifted early (left) or late (right) by a phase that is less than a quarter of the frame, i.e., less than ±T/4, so that the PWM D signal 502 abuts, but does not cross, the frame boundary. When two signals (a PWM D signal 502 that is wider than T/2 and a PWM B signal that is narrower than T/2) are shifted, both signals may be shifted to abut the frame boundary, such that the PWM D signal 502 is shifted by less than a quarter of the frame width and the PWM B signal is shifted by more than a quarter of the frame width. In this instance, the sum of the PWM D signal 502 and PWM B signal over two frames has zero content at the frame repetition rate in the Fourier Transform, which cancels the carrier in the common mode signal. This particular example can be referred to as a quarter frame asymmetrical pulse shifting with no wrap-around.

Alternatively, the PWM D signal 502 can be shifted by plus or minus a quarter of the frame, and any portion of the PWM D signal 502 that crosses the frame boundary can be wrapped to an opposing frame boundary within the same PWM frame. This alternative example can be referred to as a quarter-frame symmetrical pulse shift with wrap-around.

In a particular example, a pulse edge control circuit may be adapted to selectively apply a carrier suppression operation that includes selectively shifting one or more PWM signals by plus or minus a quarter of the frame width using quarter-frame symmetrical pulse shifting with no wrap-around, quarter-frame asymmetrical pulse shifting with no wrap-around, or quarter-frame symmetrical pulse shifting with wrap-around, depending on the implementation.

Figure 6:
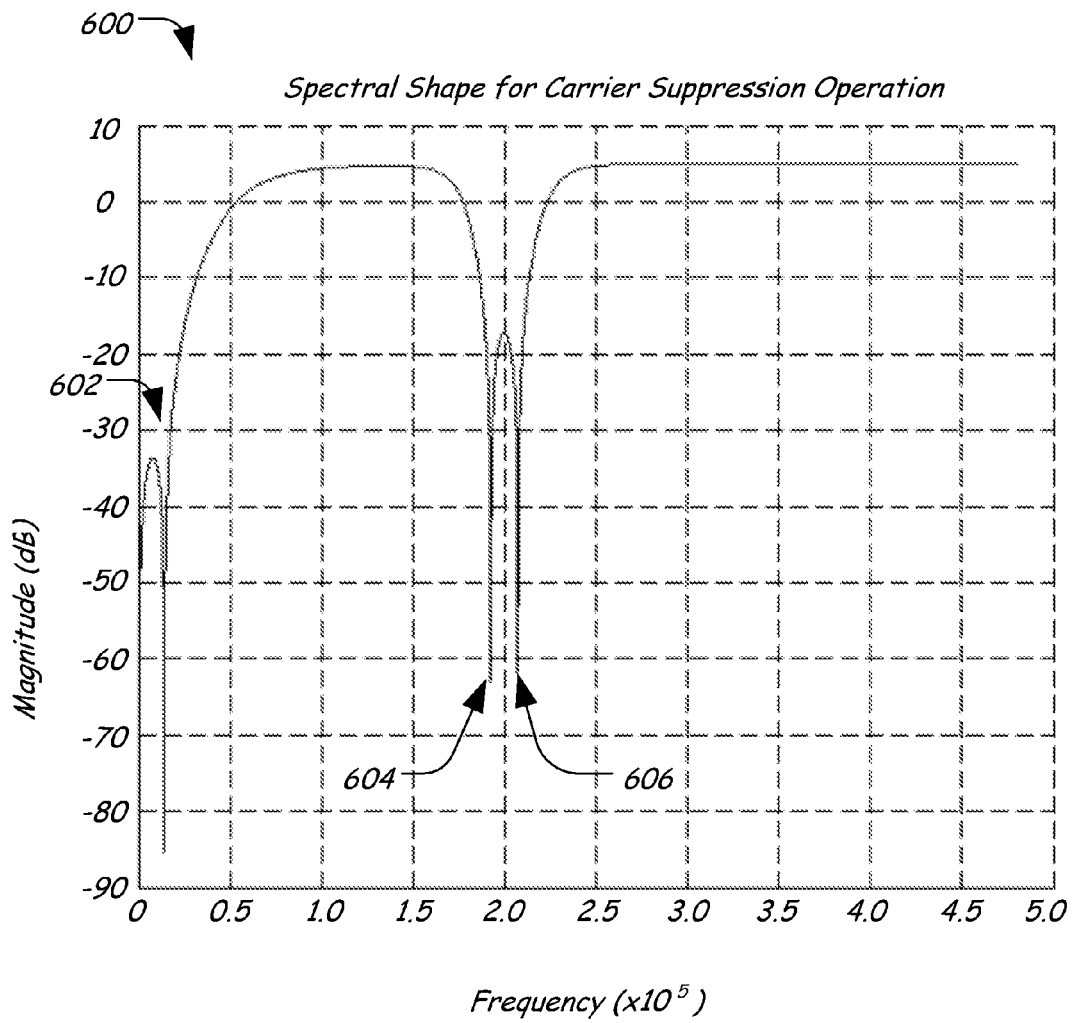
FIG. 6 is a graph of a particular illustrative embodiment of a spectral shape of a shaped random pulse sequence that can be used to shape a power spectrum of at least one PWM signal to produce at least one modulated PWM signal having a desired spectral shape.

FIG. 6 is a graph of an illustrative embodiment of a particular spectral shape 600 of a shaped random pulse sequence that can be used to define the power spectrum of at least one PWM input signal to produce at least one modulated PWM output signal having a desired spectral shape. The spectral shape 600 includes two band-stop regions, one with attenuation from 0-20 kHz resulting from nulls or notches at DC (0 kHz) and near 20 kHz (generally indicated at 602), and a second with attenuation around a selected frequency of interest resulting from nulls or notches at 200 kHz+/−10 kHz (generally indicated at 604 and 606). In a particular embodiment, it is desirable to suppress the large tone at the PWM frame rate and its harmonics to reduce peak radiated energy. In another particular embodiment, it is desirable to further attenuate spectral energy within a selected frequency band for improved AM radio reception. Further, in a particular embodiment, it is desirable to have little or no noise within a frequency band from approximately 0-20 kHz to prevent audible noise from coupling into a speaker in an audio application.

Figure 7:
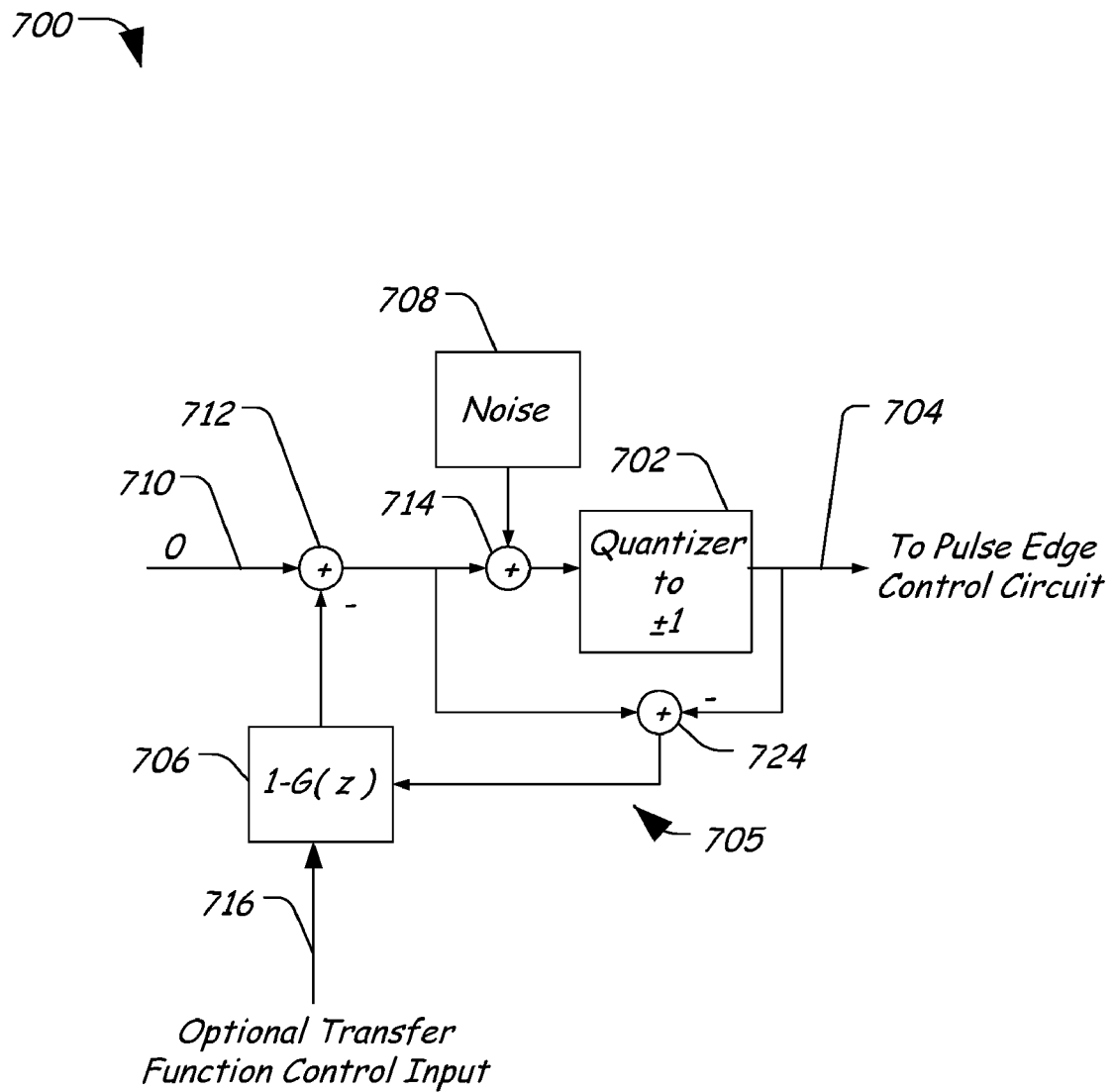
FIG. 7 is a block diagram of a particular illustrative embodiment of a sigma-delta circuit adapted for use as a shaped random pulse sequence generator that is programmable to produce a random pulse sequence having a particular spectral shape.

FIG. 7 is a block diagram of a particular illustrative embodiment of a sigma-delta circuit 700 adapted for use as a shaped random pulse sequence generator that produces a random pulse sequence having a programmable spectral shape, such as the particular spectral shape 600 illustrated in FIG. 6. In preferred embodiments, the stop-band at 200 kHz+/−10 kHz in FIG. 6 can be programmed for specific locations to reduce PWM radiation in desired frequency bands. The sigma-delta circuit 700 includes a quantizer 702 to produce a random pulse sequence having values of plus or minus one at an output 704. The sigma-delta circuit 700 further includes a feedback loop 705 that has a transfer function (1−G(z)) 706. In this embodiment, the transfer function 706 is programmable via a transfer function control input 716 to alter the transfer function of the feedback loop 705. The sigma-delta circuit 700 includes a noise input 708 and a signal input 710 having a zero input value. The signal input 710 is coupled to a first summing node 712 that produces a first result that is a difference between a feedback value received from the feedback loop 705 (from the transfer function 706) and the zero input value. The first result is provided to a summing node 724, which subtracts a value at the output 704 from the first result to produce a feedback result that is provided to the transfer function 706. Additionally, the first result is provided to a second summing node 714, which adds the first result to a noise signal from the noise input 708 to produce a second result. The second result is provided to the quantizer 702.

In a particular embodiment, the sigma-delta circuit 700 can be implemented as digital circuits, analog circuits, firmware, or any combination thereof. In another particular embodiment, the transfer function 706 is configurable (programmable) via the transfer function control input 716 to produce a particular spectral shape, which may or may not have notches at particular frequencies. The random pulse sequence at the output 704 is consequently shaped by the transfer function 706. The output 704 may be coupled to a pulse edge control circuit that is adapted to selectively apply a carrier suppression operation (such as a selective phase shift operation or a selective chop/no chop operation) according to values of the random pulse sequence.

Figure 8:
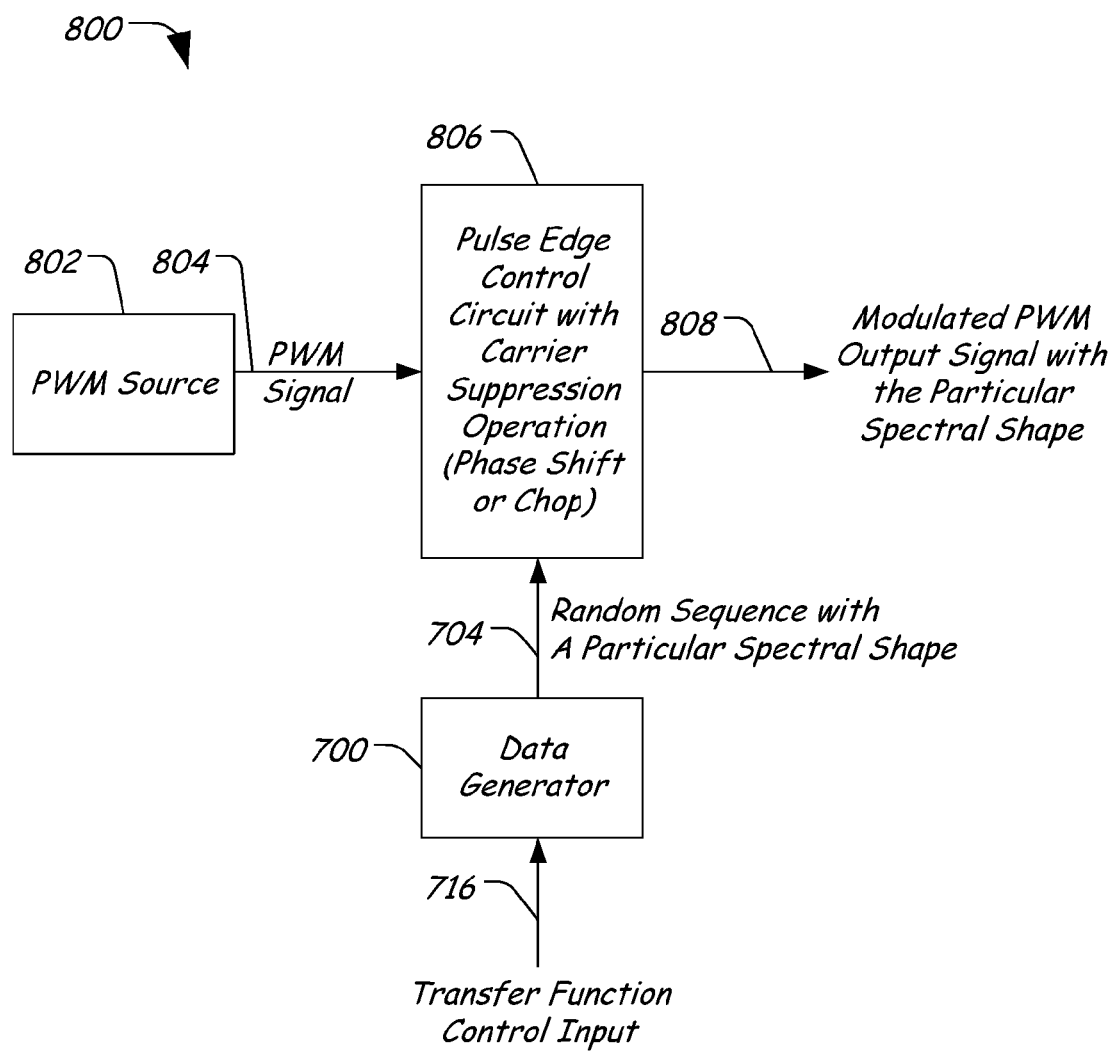
FIG. 8 is a block diagram of a system including a pulse edge control circuit that is responsive to a data generator, such as the sigma-delta circuit illustrated in FIG. 7, to selectively phase shift or to selectively chop at least one PWM signal according to values associated with the random pulse sequence to produce at least one modulated PWM output having the particular spectral shape.

FIG. 8 is a block diagram of a system 800 including a pulse edge control circuit 806 that is adapted to apply a carrier suppression operation to an input PWM signal according to values of a shaped random pulse sequence generator to produce at least one modulated PWM output having the particular spectral shape as defined by the data generator. The system 800 includes a pulse-width modulated (PWM) source 802 that provides at least one PWM signal 804 to a pulse edge control circuit 806. The system 800 also includes the sigma-delta circuit 700 illustrated in FIG. 7 that provides a random sequence with a particular spectral shape 704 to the pulse edge control circuit 806. The resulting output spectrum of signal 808 is effectively the convolution of the input PWM spectrum with the spectrum of the random pulse sequence.

In a particular example, the pulse edge control circuit 806 is adapted to selectively phase shift the at least one PWM signal 804 by plus or minus a quarter of a PWM frame width relative to a center of the PWM frame at integer sub-multiples of a frame repetition rate. In another particular example, the pulse edge control circuit 806 is adapted to selectively chop or not chop the at least one PWM signal 804. In a particular example, the shift or the chop can be selectively applied by the pulse edge control circuit 806 based on values of the random pulse sequence with the particular spectral shape 704. The resulting modulated PWM output signal has a suppressed carrier energy at the carrier frequency, which energy is spread to other frequencies and the overall spectral shape at 808 is defined by the spectral shape of the data generator output, 700.

Figure 1:
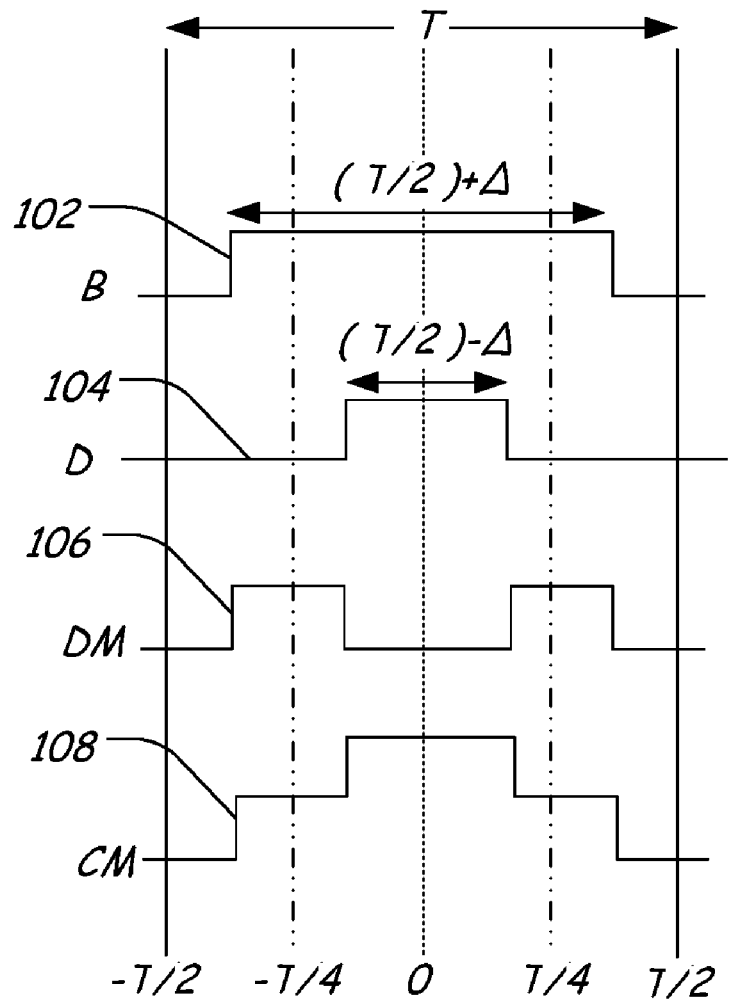
FIG. 1 is a graph of a particular representative embodiment of a conventional BD-D PWM signal where pulse widths of two pulse waves are varied, which pulse waves are time-aligned and often centered within a pulse width modulated (PWM) frame.
Figure 2:
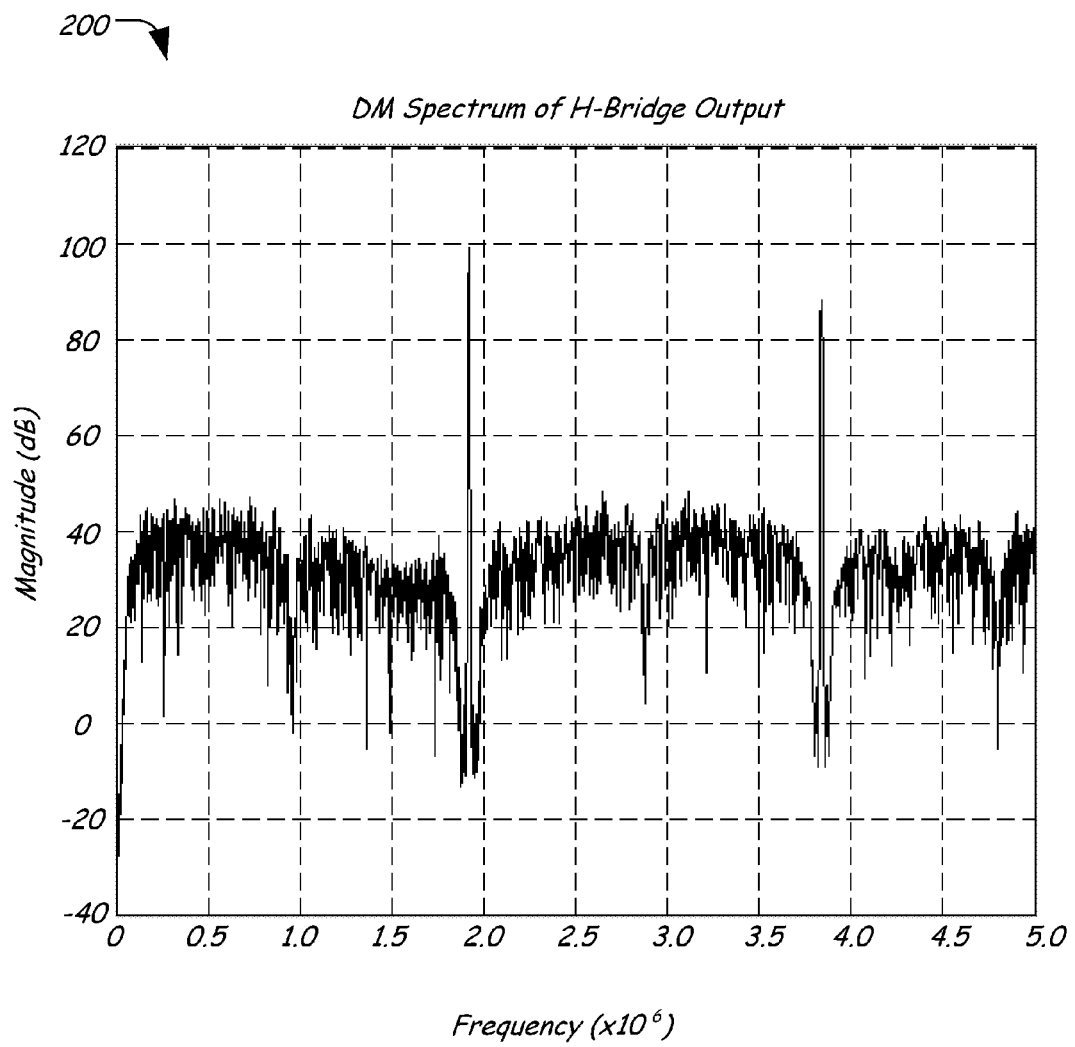
FIG. 2 is a graph of a differential mode (DM) power spectrum of the PWM signals illustrated in FIG. 1 with a time-varying delta ($\Delta$) and a frame rate of 960 kHz.
Figure 3:
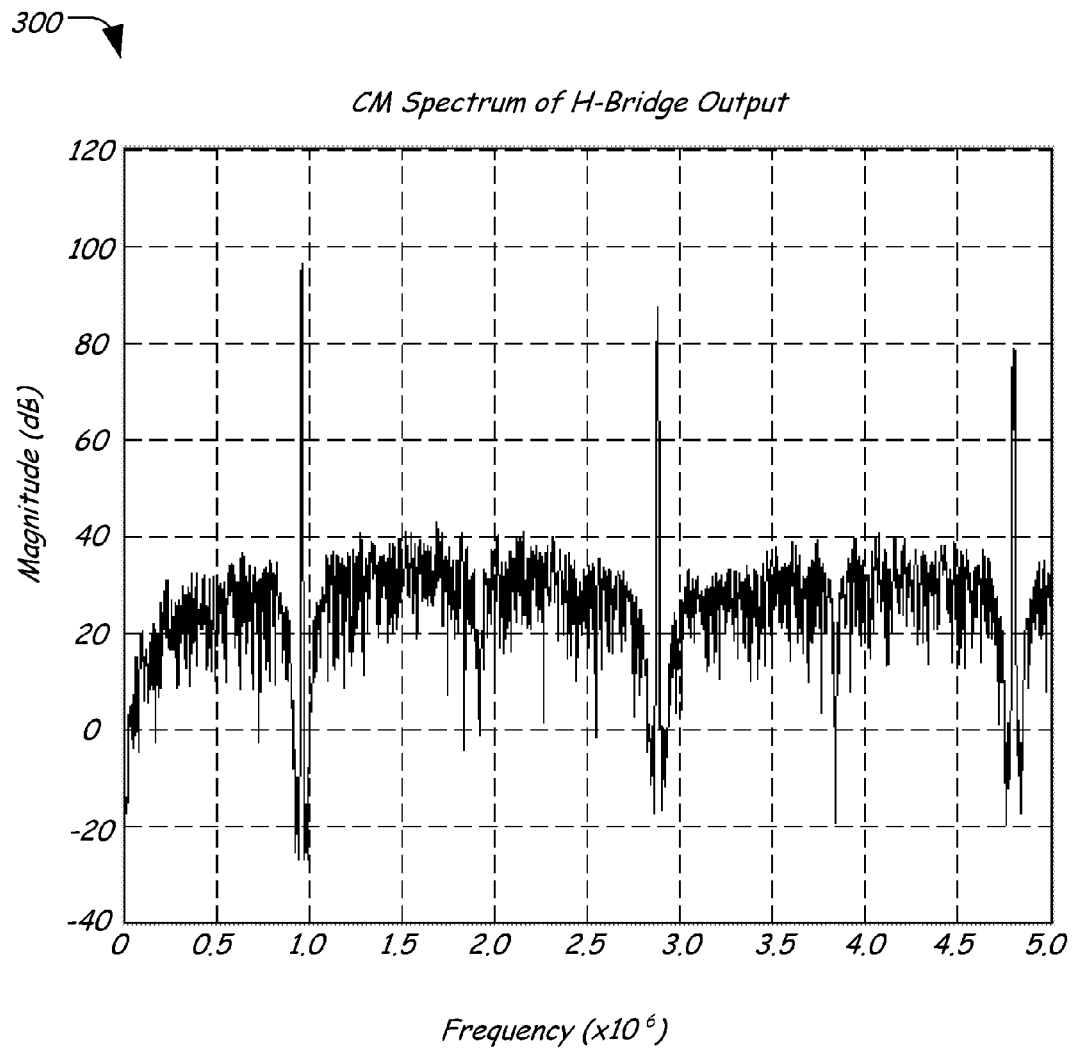
FIG. 3 is a graph of a common mode (CM) power spectrum of the PWM signals illustrated in FIG. 1 with a time-varying delta (Δ) and a frame rate of 960 kHz.
Figure 9:
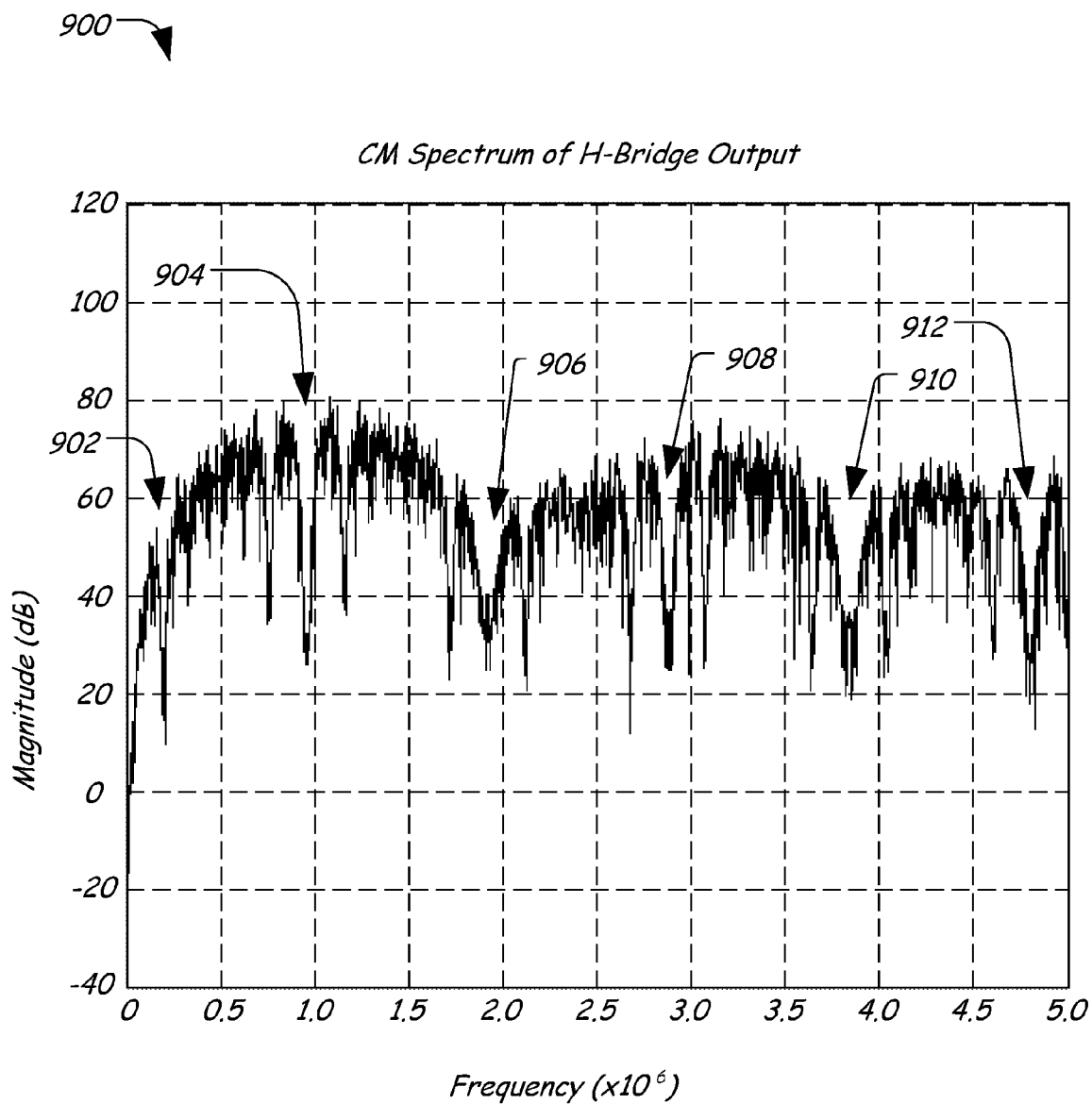
FIG. 9 is a graph of a particular illustrative example of a common mode power spectrum associated with a modulated PWM output signal produced by selectively chopping or not chopping a PWM signal and its duty cycle complement (within limits of time quantization effects) according to values of a random pulse sequence produced by a data generator, such as the sigma-delta circuit illustrated in FIG. 7.

FIG. 9 is a graph of a particular illustrative example of a power spectrum 900 of the output PWM signal 808 in FIG. 8. In this case, the programmable stop-band was set to be 200 kHz and the PWM frame rate is 960 kHz. The common mode power spectrum 900 has been spread as compared to the common mode power spectrum 300 illustrated in FIG. 3. Further, the common mode power spectrum 900 does not include large common mode power components that contribute to AM interference (AMI) or electromagnetic interference (EMI). Further, the common mode power spectrum 900 includes little noise in the audio frequency band, and notches have been placed at n*960 kHz+/−200 kHz, where n is a non-negative integer, as indicated at 904, 906, 908, 910, and 912. Further, the graph 900 includes a notch at 0 kHz and at 20 kHz, as indicated at 902. In an alternate example, should the programmable stop-band be centered at 300 kHz, the notches would be located at n*960 kHz+/−300 kHz.

Figure 10:
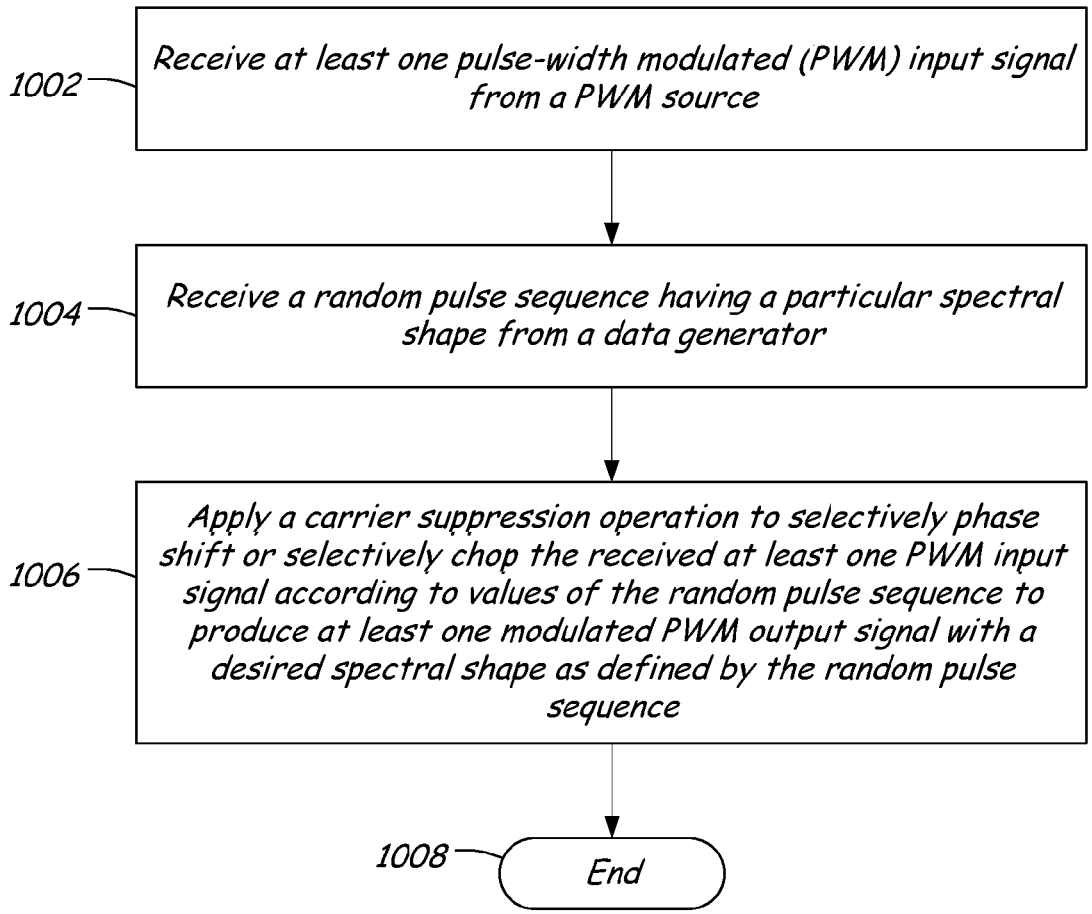
FIG. 10 is a flow diagram of a particular illustrative embodiment of a method of shaping an output power spectrum associated with at least one modulated PWM output signal.

FIG. 10 is a flow diagram of a particular illustrative embodiment of a method of shaping an output power spectrum associated with at least one modulated PWM output signal. At 1002, at least one pulse-width modulated (PWM) input signal is received from a PWM source. Continuing to 1004, a random pulse sequence having a particular spectral shape is received from a data generator. In a particular embodiment, the particular spectral shape includes notches at selected frequencies. Proceeding to 1006, a carrier suppression operation is applied to selectively phase shift or to selectively chop the received at least one PWM input signal according to values of the random pulse sequence to produce at least one modulated PWM output signal with a desired spectral shape as defined by the random pulse sequence. In a particular embodiment, the at least one modulated PWM output signal has carrier energy that is spread to frequencies other than a carrier frequency and its harmonics. In a particular embodiment, the carrier suppression operation can be applied at integer sub-multiples of a PWM frame repetition rate or at a rate that is faster than the frame repetition rate. The method terminates at 1008.

In a particular embodiment, the method further includes programming the data generator to produce the particular spectral shape. In another particular embodiment, the data generator includes a feedback loop having a programmable transfer function. In still another particular embodiment, the data generator has a nominally white noise input. The data generator shapes the white noise source to produce an output pulse sequence having the desired spectral shape often with notches at programmable frequency locations.

In conjunction with the systems, circuits, and methods described above with respect to FIGS. 4-10, a circuit device is disclosed that is adapted to utilize a random data sequence having a particular spectral shape to control application of a carrier suppression operation. In a particular example, a pulse edge control circuit selectively phase shifts a pulse-width modulated (PWM) input signal and its PWM duty cycle complement by plus or minus a quarter of a frame width at integer sub-multiples of a frame repetition rate based on values of the random data sequence. In another particular example, the pulse edge control circuit selectively chops (i.e., chops or does not chop) at least one PWM input signal based on values of the random data sequence. In either instance, the resulting modulated PWM output has an altered carrier spectrum that has a spectral shape defined by the particular spectral shape of the random data sequence, including any frequency notches in the particular spectral shape. The resulting modulated PWM output signal has reduced carrier energy at a carrier frequency and at harmonics of the carrier frequency and exhibits reduced AM interference (AMI) and reduced electromagnetic interference (EMI) with respect to adjacent circuitry.

Although the present invention has been described with reference to preferred embodiments, workers skilled in the art will recognize that changes may be made in form and detail without departing from the spirit and scope of the invention.

What is claimed is:

1. A circuit comprising:
    an input terminal for receiving a pulse sequence having a particular spectral shape; and
    a pulse edge control circuit to selectively apply a carrier suppression operation to at least one pulse-width modulated (PWM) signal in response to the pulse sequence to produce at least one adjusted PWM output signal;
    wherein spectral energy of a carrier signal of the at least one adjusted PWM output signal at a carrier frequency of the carrier signal and harmonics of the carrier frequency is changed such that the at least one adjusted PWM output signal has a spectral shape defined by the particular spectral shape.

2. The circuit of claim 1, wherein the pulse sequence is received at an integer sub-multiple of a PWM frame repetition rate.

3. The circuit of claim 1, wherein the particular spectral shape includes notches at specified frequencies, and wherein the spectral shape of at least one adjusted PWM output signal includes notches at desired frequencies.

4. The circuit of claim 1, wherein the carrier suppression operation comprises a phase shift operation that is applied to selectively shift the at least one PWM input signal by plus or minus a quarter of a frame relative to a center of the frame according to the pulse sequence.

5. The circuit claim 1, wherein the carrier suppression operation comprises a chop operation that is selectively applied to chop or not chop the at least one PWM input signal with its duty cycle complement PWM signal according to the pulse sequence.

6. The circuit of claim 5, wherein the pulse edge control circuit selectively applies the chop operation by inverting the at least one PWM input signal and its duty cycle complement PWM signal and interchanging the duty cycle complement PWM signal with the at least, one PWM input signal to produce the at least one adjusted PWM output signal.

7. The circuit of claim 1 further comprising:
    a sigma-delta modulator including a zero input signal, a random input noise sequence and a noise transfer function defined by a feedback loop;
    wherein the pulse sequence is related to an output signal of the sigma-delta modulator.

8. The circuit of claim 7, wherein the noise transfer function is programmable to create a plurality Of spectral shapes, wherein at least one of the plurality of spectral shapes includes one or more notches at desired frequencies.

9. A circuit comprising:
    a data generator including a signal input to a first circuit configured to apply a signal transfer function, a noise input to a second circuit configured to apply a noise transfer function, and an output for providing a bit sequence, the signal input configured to receive a first input signal that is substantially constant, the noise input configured to receive a second input signal;
    a logic circuit to selectively apply a carrier suppression operation to at least one pulse-width modulated (PWM) signal in response to receiving the bit sequence to produce at least one adjusted PWM output signal, the at least one modulated PWM output signal having an adjusted spectral shape relative to a spectral shape of the at least one PWM signal.

10. The circuit of claim 9, wherein the second input signal comprises a random signal.

11. The circuit of claim 9, wherein the second input signal comprises a deterministic signal.

12. The circuit of claim 9, wherein the first input signal is a zero value signal.

13. The circuit of claim 9, wherein the data generator comprises a sigma-delta modulator.

14. The circuit of claim 9, wherein the first circuit and the second circuit are programmable to adjust the noise transfer function and the signal transfer function, respectively.

15. The pulse edge control circuit of claim 9, wherein the hit sequence is a random bit sequence, and wherein energy associated with a carrier signal of the at least one adjusted PWM output signal is spread in frequency.

16. The pulse edge control circuit of claim 9, wherein the at least one PWM signal comprises:
   a first PWM signal; and
   a second PWM signal;
   wherein the carrier suppression operation comprises a phase shift operation; and
   wherein the logic circuit selectively applies the phase shift operation to selectively shift the first and second PWM signals by plus or minus a portion of a frame relative to a center of the frame according to the hit sequence.

17. The pulse edge control circuit of claim 9, wherein the carrier suppression operation comprises a chop operation; and
   wherein the logic circuit selectively applies the chop operation to chop or not chop the at least one PWM signal and its duty cycle complement according to the bit sequence, wherein the chop operation includes inverting and interchanging the at least one PWM signal with the duty cycle complement.

18. The pulse edge control circuit of claim 9, wherein the bit sequence comprises a random sequence of values of either plus or minus one.

19. The pulse edge control circuit of claim 9, further comprising:
   an output terminal for providing the at least one adjusted PWM output signal; and
   wherein the output terminal is configurable to be coupled to at least one of a speaker driver circuit for controlling an audio application, a power control circuit for controlling a power control application, and a motor circuit for controlling a motor control application.

20. A method comprising:
   receiving at least one pulse-width modulated (PWM) signal from a PWM source;
   receiving a bit sequence having a particular spectral shape from a data generator; and
   selectively applying a carrier suppression operation to at least one PWM signal according to the bit sequence to produce at least one modulated PWM output signal with an adjusted spectral shape relative to a spectral shape of the at least one PWM signal.

21. The method of claim 20, wherein the particular spectral shape includes notches at selected frequencies; and
   wherein the adjusted spectral shape includes notches at the selected frequencies.

22. The method of claim 20, further comprising programming the data source to produce the bit sequence having the particular spectral shape.

23. The method of claim 22, wherein the data source comprises:
   a sigma-delta modulator comprising:
   a signal input coupled to a first circuit configured to apply a signal transfer function, the signal input to receive a first input signal having a substantially constant value;
   a noise input coupled to a second circuit configured to apply a noise transfer function, the noise input to receive a second input signal; and
   an output configured to couple to a pulse edge control circuit and adapted to provide the bit sequence.

* * * * *